(12) United States Patent
Gao

(10) Patent No.: US 12,264,999 B2
(45) Date of Patent: Apr. 1, 2025

(54) SERVER RACK TESTING AND VERIFICATION UNIT AND METHOD

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 799 days.

(21) Appl. No.: 17/483,931

(22) Filed: Sep. 24, 2021

(65) Prior Publication Data

US 2023/0103090 A1    Mar. 30, 2023

(51) Int. Cl.
- H05K 7/00 (2006.01)
- G01M 99/00 (2011.01)
- H05K 7/20 (2006.01)
- G01M 3/26 (2006.01)

(52) U.S. Cl.
CPC ...... G01M 99/002 (2013.01); H05K 7/20781 (2013.01); G01M 3/26 (2013.01)

(58) Field of Classification Search
CPC ... G01M 99/022; G01M 3/26; H05K 7/20781
See application file for complete search history.

(56) References Cited

U.S. PATENT DOCUMENTS 3,729,051 A * 4/1973 Mannion .................. F24F 11/84
  165/246
8,295,047 B1 * 10/2012 Hamburgen ....... H05K 7/20827
  165/110
8,526,183 B1 * 9/2013 Hamburgen ......... H05K 7/2079
  361/679.48
2005/0228618 A1 * 10/2005 Patel ....................... G06F 9/505
  702/188
2008/0291626 A1 * 11/2008 Nelson ................. H05K 7/2079
  361/696

(Continued)

FOREIGN PATENT DOCUMENTS

AU    2016101872 A4 * 11/2016
CN    108334406 A   *  7/2018

(Continued)

OTHER PUBLICATIONS

17483931_2024-07-17_EP_3068205_A1_H.pdf, Aug. 10, 2017.*

(Continued)

Primary Examiner — Gail Kaplan Verbitsky
(74) Attorney, Agent, or Firm — WOMBLE BOND DICKINSON (US) LLP

(57) ABSTRACT

Methods, systems, and devices for electronic rack level testing and/or verification are disclosed. The disclosed systems may provide for automated testing of electronic racks that may include fluid recirculation systems. To provide for automated testing, a test unit of a system may automatically and without manual intervention circulate coolant to an electronic rack under test. The testing unit may also pressurize the electronic rack. The testing unit may further depressurize the electronic rack to provide for efficient delivering, deployment commissioning, and reduce the likelihood of coolant circulation issues occurring when initially deployed. A testing server of the system may also provide for load testing and thermal cycling of the electronic rack in an automated manner.

20 Claims, 9 Drawing Sheets

(56) References Cited

U.S. PATENT DOCUMENTS

| | | | |
|---|---|---|---|
| 2015/0355630 A1* | 12/2015 | Cader | G05B 19/408 |
| | | | 700/9 |
| 2016/0270267 A1* | 9/2016 | Chainer | H05K 7/20781 |
| 2017/0105317 A1* | 4/2017 | Heydari | H05K 7/20745 |
| 2021/0302088 A1* | 9/2021 | Shao | F25B 49/02 |

FOREIGN PATENT DOCUMENTS

| | | | | |
|---|---|---|---|---|
| CN | 110989741 A | * | 4/2020 | G05D 27/02 |
| CN | 112020267 A | * | 12/2020 | C09K 5/04 |
| EP | 3068205 A1 | * | 9/2016 | G01M 3/188 |
| JP | 2017138060 A | * | 8/2017 | |
| WO | WO-2010002388 A1 | * | 1/2010 | F24F 11/0001 |
| WO | WO-2014120165 A1 | * | 8/2014 | G05B 15/02 |
| WO | WO-2018076056 A1 | * | 5/2018 | G06F 1/206 |

OTHER PUBLICATIONS

17483931_2024-07-17_JP_2017138060_A_H.pdf, Aug. 10, 2017.*
17483931_2024-07-17_WO_2014120165_A1_H.pdf, Aug. 7, 2014.*
17483931_2024-07-18_AU_2016101872_A4_H.pdf, Nov. 17, 2016.*
17483931_2024-07-18_CN_110989741_A_H.pdf, Apr. 10, 2020.*
17483931_2024-07-18_CN_112020267_A_H.pdf, Dec. 1, 2020.*
17483931_2024-07-18_WO_2018076056_A1_H.pdf, May 3, 2018.*
17483931_2024-12-04_CN_108334406_A_H.pdf, Jul. 27, 2018.*
17483931_2024-12-04_WO_2010002388_A1_H.pdf, Jan. 7, 2010.*

* cited by examiner

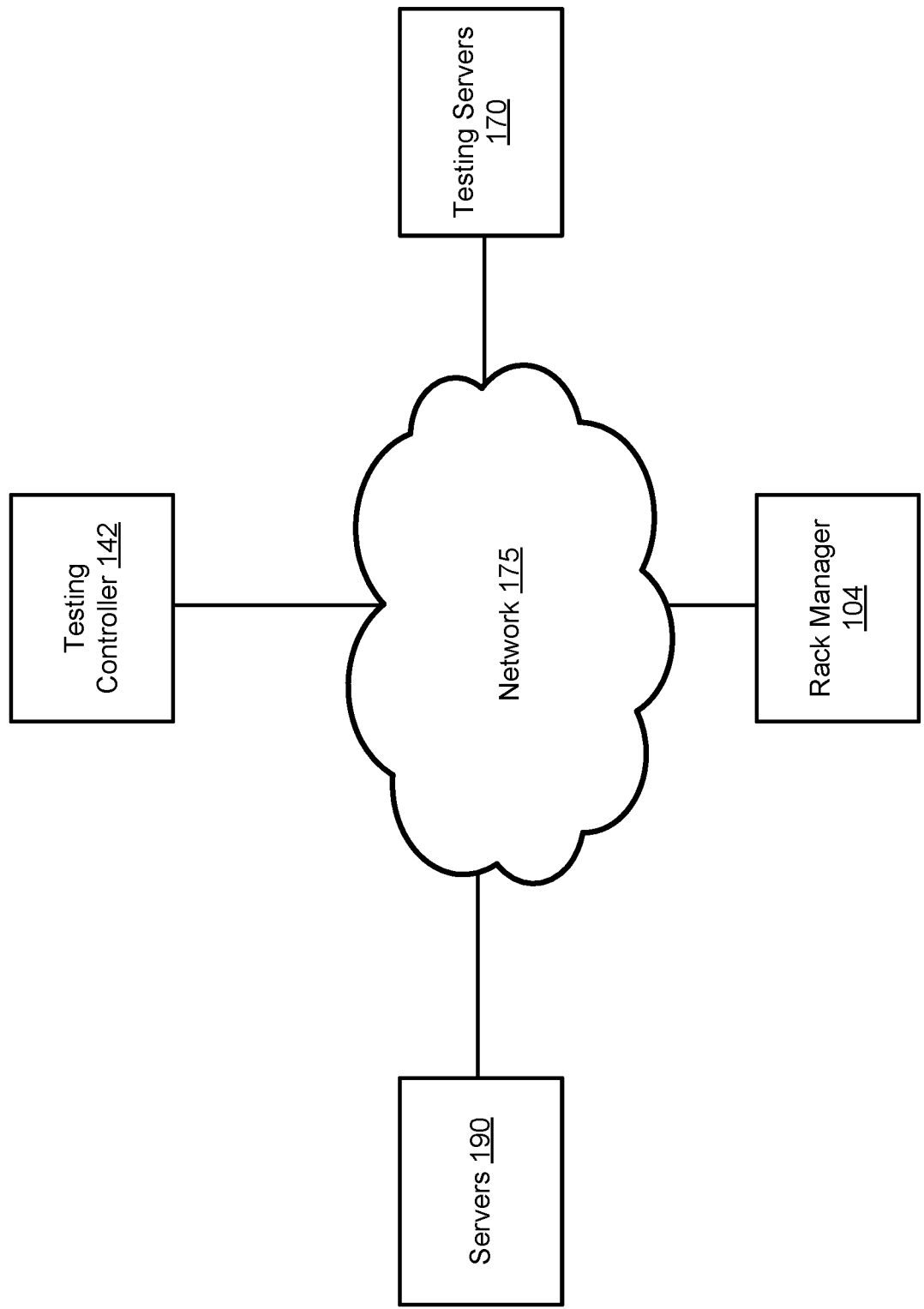

SERVER RACK TESTING AND VERIFICATION UNIT AND METHOD

FIELD OF THE INVENTION

Embodiments of the present invention relate generally to electronic rack testing and validation. More particularly, embodiments of the invention relate to automation of testing and validation of electronic racks that are populated with liquid cooling servers.

BACKGROUND

Cooling is a prominent factor in a computer system and data center design. The number of high performance electronics components and devices such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is needed for operations of these servers in data centers, as well as the server performance and lifetime.

As deployable units of data centers increase in complexity, so do the number of potential points of failure of substandard operation increase. The increasing number of failure points makes it more likely that deployable units will operate in a manner that deviates from their expected operation. To facilitate proper operation of a data center, many of the deployed units may need to operate as expected. If a deployed unit does not operate as expected, the overall operation of the data center may be impacted.

BRIEF DESCRIPTION OF THE DRAWINGS

Embodiments of the invention are illustrated by way of example and not limitation in the figures of the accompanying drawings in which like references indicate similar elements.

FIG. 1D shows a diagram of a communication environment according to an embodiment.

DETAILED DESCRIPTION

Figure 1A:
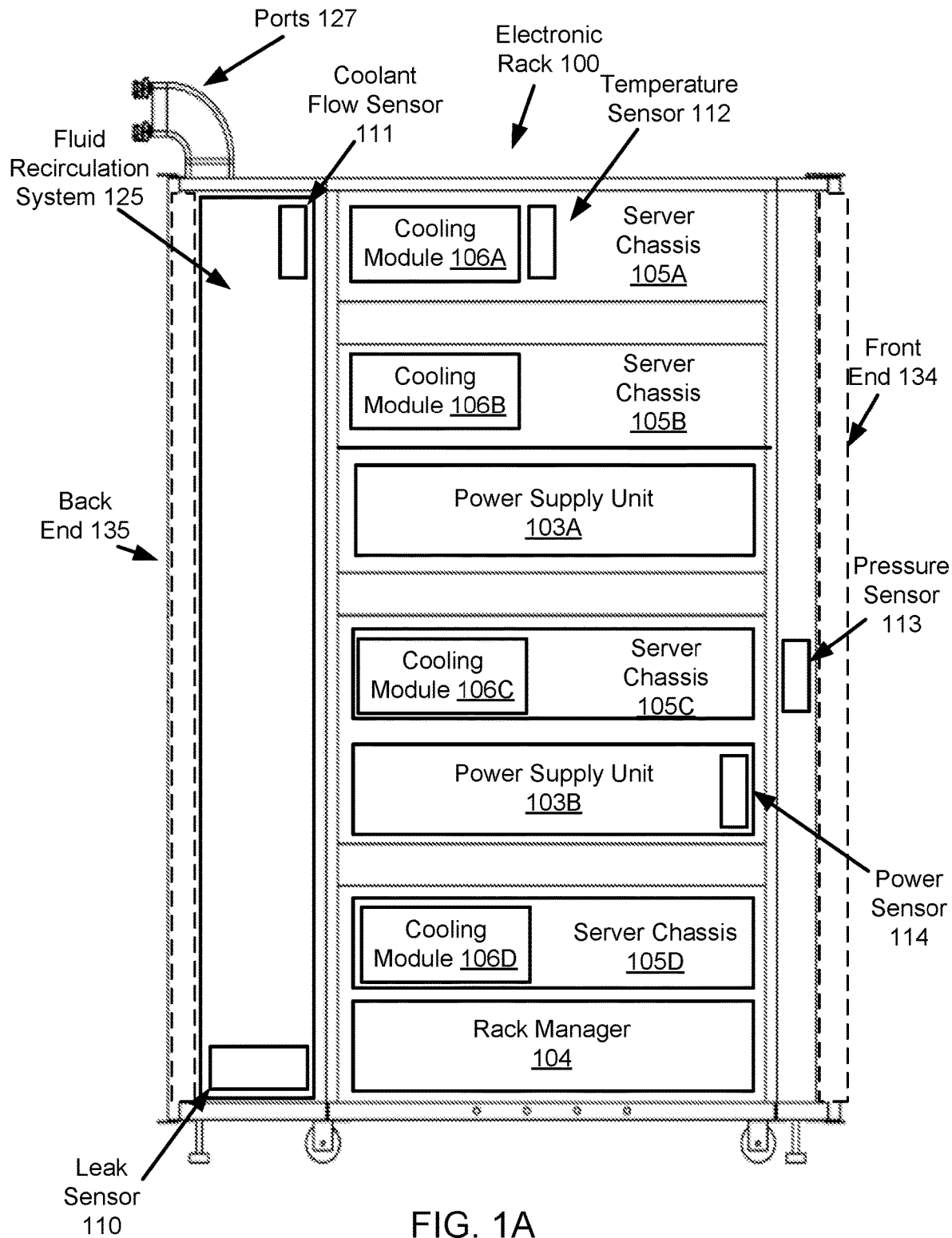
FIG. 1A shows a diagram of an electronic rack according to an embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment", "an embodiment", or "one or more embodiments" means that a particular feature, structure, or characteristic described in conjunction with the embodiment can be included in at least one embodiment of the invention. The appearances of the phrase "in one embodiment" in various places in the specification do not necessarily all refer to the same embodiment.

In general, embodiments disclosed herein provide methods, systems, and devices for electronic rack level testing and verification. The disclosed systems may provide for automated testing of electronic racks that may include fluid recirculation systems. To provide for automated testing, a test unit in accordance with an embodiment may automatically and without manual intervention (i) circulate coolant to an electronic rack under test, (ii) pressurize the electronic rack, and (iii) depressurize the electronic rack to provide for efficient deployment and reduce the likelihood of coolant circulation issues occurring when initially deployed.

While the testing unit is performing the above noted functions, a test server which may orchestrate the overall testing process may automatically and without manual intervention (i) instantiate computer implemented workloads on the electronic rack, (ii) thermally cycle the electronic rack, (iii) collect operation information of the electronic rack during testing, and/or (iv) ascertain whether the operation of the electronic rack has deviated from an expected operation. If the electronic rack deviates from the expected operation (e.g., not in a deployable state), the electronic rack may be sent for remediation (e.g., repair, modification, debugging, etc.). Otherwise, the electronic rack may be treated as being in a deployable state (e.g., likely to be successfully deployed in an efficient manner)

In addition to using the collected operation information to ascertain whether the electronic rack is in a deployable state, the collected operation information may be used to rate the likely reliability and/or performance of the electronic rack Such information may be usable improve the overall end to end efficiency of electronic rack cooling, including the design, assembly, testing, and/or deployment.

In an embodiment, a testing system for preparing electronic racks is provided. The electronic racks may include servers for a deployment and a fluid recirculation system to cool the servers. The testing system may include a testing unit to: apply fluids to an electronic rack of the electronic racks, and fluidly prepare the electronic rack for coolant when deployed to the deployment. The testing system may also include a testing server that includes a processor and memory, the processor, when executing a set of computing instructions, is to: perform, with the testing unit, a coolant circulation testing on the fluid recirculation system; perform, with the testing unit, a workload testing on the electronic rack; perform, with the testing unit, a thermal cycle testing on the electronic rack; perform, with the testing unit, a pressure testing on the fluid recirculation system; and prepare, with the testing unit, the electronic rack for the deployment.

In an embodiment, the testing unit includes a pneumatic pressure system, a cooling system, and a fluid connection manager. The fluid connection manager is to fluidly couple the pneumatic pressure system to the fluid recirculation system, fluidly isolate the pneumatic pressure system from the fluid recirculation system, fluidly couple the cooling system to the fluid recirculation system, and fluidly isolate the cooling system from the fluid recirculation system.

In an embodiment, the pneumatic pressure system includes a pump to pressurize the fluid recirculation system to a first pressure above normal operating pressure while the pump is fluidly coupled to the fluid recirculation system; and a vacuum to depressurize the fluid recirculation system to establish a vacuum environment.

In an embodiment, preparing, with the testing unit, the electronic rack for the deployment includes fluidly isolating, with the fluid connection manager, the pump from the fluid recirculation system; fluidly isolating, with the fluid connection manager, the cooling system from the fluid recirculation system; and operating the vacuum while the vacuum is fluidly coupled to the fluid recirculation system until the fluid recirculation system is depressurized to the second pressure.

In an embodiment, performing, with the testing unit, the pressure testing on the fluid recirculation system includes fluidly isolating, with the fluid connection manager, the vacuum from the fluid recirculation system; fluidly isolating, with the fluid connection manager, the cooling system from the fluid recirculation system; operating the pump while the pump is fluidly coupled to the fluid recirculation system until the fluid recirculation system is pressurized to the first pressure; while operating the pump, collecting operation data for the fluid recirculation system; and storing the operation data in a test result repository.

The cooling system may include a cooler to cool coolant circulating through it while the cooler is fluidly coupled to the fluid recirculation system.

The cooling system may include a condenser to condense vapor from the fluid recirculation system into coolant while the condenser is fluidly coupled to the fluid recirculation system.

The fluid connection manager may include a first three-way valve and a second three-way valve. A first fluid port of the first three-way valve may be for reversible fluid connection to the fluid recirculation system, a second fluid port of the first three-way valve may be fluidly connected to the pneumatic pressure system, and a third fluid port of the first three-way valve may be fluidly connected to the cooling system.

A first fluid port of the second three-way valve may be for reversible fluid connection to the fluid recirculation system, a second fluid port of the second three-way valve may be fluidly connected to the pneumatic pressure system, and a third fluid port of the second three-way valve may be fluidly connected to the cooling system.

In an embodiment, the first three-way valve and the second three-way valve are both operably connected to the testing server, and the testing server is to provide instructions to the first three-way valve and the second three-way to form: a first fluid flow path between the fluid recirculation system and the pneumatic pressure system; and a second fluid flow path between the fluid recirculation system and the cooling system. Forming the first fluid flow path may seal the second fluid flow path, and forming the second fluid flow path may seal the first fluid flow path.

The workload testing and the thermal testing may be both performed, at least in part, while the coolant circulation testing is performed. The pressure testing may be performed after the coolant circulation testing is complete. The pressure testing may be performed after the coolant circulation testing is complete.

In an embodiment, the fluids include a coolant circulated to the fluid recirculation system during the coolant circulation testing. The fluids may also include a gas pumped into the fluid recirculation system during the pressure testing. The coolant may be removed prior to the gas being pumped into the fluid recirculation system.

In an embodiment, a method for preparing electronic racks is provided. The electronic rack may include servers for a deployment and a fluid recirculation system to cool the servers. The method may include performing, with a testing unit, a coolant circulation testing on the fluid recirculation system of an electronic rack of the electronic racks by circulating a first fluid through the fluid recirculation system; performing, with the testing unit, a workload testing on the electronic rack; performing, with the testing unit, a thermal cycle testing on the electronic rack; performing, with the testing unit, a pressure testing on the fluid recirculation system by pumping a second fluid into the fluid recirculation system; and preparing, with the testing unit, the electronic rack for the deployment by vacuuming the second fluid out of the fluid recirculation system.

Pumping the second fluid into the fluid recirculation system may raise a pressure of the fluid recirculation system above a normal operating pressure of the fluid recirculation system, and vacuuming the second fluid out of the fluid recirculation system may establish a vacuum environment in the fluid recirculation system.

The coolant circulation testing, the workload testing, the thermal cycle testing, and the pressure testing may be automatically performed by the testing unit without changing any external fluid connections between the testing unit and the fluid recirculation system.

The coolant circulation testing, the workload testing, the thermal cycle testing, and the pressure testing may be automatically performed by changing internal fluid connections of the testing unit.

By implementing a system as discussed above, a testing unit for testing and verifying liquid cooling of electronic racks with a full population of servers may be provided. The testing unit and/or testing methods may provide for system testing and verification before deployment; facilitate system transportation of liquid cooling electronic racks; facilitate system reliability testing; facilitate onsite system verification; facilitate production evaluation; provide for high efficiency in system testing and verification; allow for full rack verification; and/or provide for design and operation method for both server, rack and end users.

FIG. 1A is block diagram illustrating an electronic rack according to one embodiment. Electronic rack 100 may represent any of the electronic racks as described throughout this application. Any number of electronic rack 100 may be deployed (e.g., sent to a particular location) to form a data center or other type of computing environment (e.g., by operably connecting the electronic racks to one another and/or to other devices via any number of wired and/or wireless networks). Computing devices positioned in electronic rack 100 may allow the computing environment to perform any number of computer implemented services (e.g., database, electronic communications, file sharing, etc.).

According to one embodiment, electronic rack 100 includes, but is not limited to, one or more power supply units 103A-103B, a rack manager 104, one or more server chassis 105A-105D (collectively referred to as server chassis 105), and fluid recirculation system 125. Each of these components is discussed below.

Server chassis 105 may be inserted into an array of server slots (e.g., standard shelves) respectively from front end 134 or back end 135 of electronic rack 100. Although there are four server chassis 105A-105D shown here, additional or fewer server chassis 105 may be maintained within electronic rack 100. Also note that the particular positions of power supply units 103A-103B, rack manager 104 (e.g., a rack management controller), and/or server chassis 105 are shown for purposes of illustration only; other arrangements or configurations of these components may also be implemented. In one embodiment, electronic rack 100 can be either open to the environment or partially contained by a rack container.

Each of server chassis 105 may include one or more computing components (e.g., central processing units (CPUs), general/graphic processing units (GPUs), memory, and/or storage devices that may be in aggregate one or more computing devices. Any of the computing components may perform, for example, data processing tasks (e.g., storing information, performing calculations using stored information to obtain new information, etc.). One or more of the computing components may execute software stored in a storage device or other persistent storage medium. The software may be loaded into the memory, and may be executed by one or more processors (e.g., computing components) to perform the data processing tasks.

Server chassis 105 may include a host server (referred to as a host node) coupled to one or more compute servers (also referred to as computing nodes, such as CPU server and GPU server, any of which may be implemented with the server chassis 105). The host server (having one or more CPUs) may interface with clients over a network (e.g., Internet) to receive a request for a particular service such as storage services (e.g., cloud-based storage services such as backup and/or restoration), processing services, and/or any other type of services.

In response to the request, the host server may execute an application to perform certain operations (e.g., image processing, deep data learning algorithms or modeling, etc., as, for example, a part of a software-as-a-service (SaaS) platform). In response to the request, the host server may distribute the tasks to one or more of the computing nodes or compute servers (e.g., having one or more CPUs, GPUs, other types of special purposes hardware devices, etc.) managed by the host server. The compute servers and/or host server may perform the tasks, which may consume electrical power and generate heat during the operations carried out to perform the tasks.

To manage the heat generated during operation, any of server chassis 105 may include any number of cooling modules 106A-106D (collectively, cooling modules 106). Any number of cooling modules may be positioned with a server chassis and/or other device to provide cooling. The cooling modules 106 may include cold plates to cool corresponding computing components (e.g., processors, memory devices, persistent storage devices, communications devices, special purpose hardware devices such as application specific integrated circuits, graphics processing units, etc.). In an embodiment, the cooling modules 106 are fluid cooling devices that utilize coolant to cool the computing components. The cooling modules 106 may receive a coolant (e.g., from fluid recirculation system 125) and transfer heat generated by the computing components into the coolant thereby cooling the computing components. The coolant may be circulated through the cooling modules 106 thereby removing heat from server chassis 105. The coolant may be circulated to other systems (not shown) to discharge the removed heat from the coolant thereby allowing the coolant to be circulated back to the cooling modules 106 for heat removal. In an embodiment, all, or a portion, of the coolant undergoes a phase change during circulating to cooled devices resulting in vapor from cool devices being circulated from the cooled devices (in addition or alternatively to liquid coolant) whereas liquid coolant may be circulated to the cooled devices.

Power supply units 103A-103B (collectively, power supply units 103) may receive power from an external supply (such as a power grid), convert it to a type of power that is compatible with other components in electronic rack 100 such as server chassis 105 and rack manager 104, and distribute the converted power to other components such as server chassis 105, rack manager 104, and/or other components. For example, power supply units 103 may receive alternating current from an external supply, convert the alternating current to direct current, and distribute the direct current to the server chassis 105, rack manager 104, and/or other components with power distribution components (e.g., one or more busbars which may be positioned by the fluid recirculation system 125).

While illustrated in FIG. 1A as being distinct components, power supplies 103 may be integrated with the server chassis 105, rack manager 104, and/or other components without departing from embodiments disclosed herein.

To orchestrate operation of components in electronic rack 100, one or more rack manager 104 may be positioned in electronic rack 100. Rack manager 104 may manage the operation of components in electronic rack 100. For example, rack manager 104 may manage the flow of coolant to server chassis 105, may manage power delivery to server chassis 105, may cause workloads to be performed with the components in the server chassis 105, may obtain sensor information (e.g., temperature of various components, presence or lack thereof of coolant and/or coolant leaks) from various sensors 110, 111, 112, 113, 114 positioned with electronic rack 100 (and/or components positioned therein), and may otherwise manage the operation of the electronic rack 100.

For example, the sensors may include one or more of (i) leak sensor 110 positioned and/or adapted to detect coolant leaks from fluid recirculation system 125, (ii) coolant flow sensor 111 positioned and/or adapted to measure pressures and flow rates of coolant and/or other fluids in fluid recirculation system 125 and/or components in fluid communication with fluid recirculation system 125, (iii) temperature sensor 112 positioned and/or adapted to measure temperatures proximate to the sensor, (iv) pressure sensor 113 positioned and/or adapted to measure pressures in various portions of electronic rack 100 and/or components positioned therein, and/or (v) power sensor 114 positioned and/or adapted to measure rates and/or quantities of power consumed by electronic rack 100 and/or components positioned therein. Any of these sensors may be implemented with one or more hardware component that include circuitry adapted to perform the corresponding detection and/or measurement. The sensors may be operably connected to rack manager 104 and/or other devices through any combination of wired and/or wireless networks.

As will be discussed in greater detail below, in one embodiment, rack manager 104 may cooperate with other devices to prepare electronic rack 100 for deployment. When doing so, rack manager 104 may, for example, instantiate workloads on various components in electronic rack 100, monitor the performance of the devices while the workloads are being performed, obtain sensor data during various portions of the process for preparing electronic rack 100 for deployment, and/or perform other actions that may prepare electronic rack 100 for deployment.

In one embodiment, rack manager 104 is implemented with one or more computing devices. The one or more computing devices may include, for example, one or more of each of processors, memory modules (e.g., devices that provide transitory storage), storage modules (e.g., devices that provide persistent storage), communications devices, etc. When providing its functionality, rack manager 104 may perform all, or a portion, of the methods illustrated and described throughout this application. To do so, the processors may execute computing instructions stored in persistent storage (local and/or remote) that cause the processors to perform the methods and functions disclosed throughout this application. These processors may be implemented with hardware processors that include circuitry. The processors may execute the computing instructions directly or may do so through one or more layers of virtualization or other types of indirection. In an embodiment, rack manager is implemented with a special purpose hardware device that includes circuitry adapted to provide the functionality of rack manager 104. The special purpose hardware device may be, for example, a programmable gate array, an application specific integrated circuit, a digital signal processor, or any other type of hardware device.

Fluid recirculation system 125 may facilitate circulation of coolant and/or vaporized coolant to and/or from server chassis 105 (and/or component therein such as cooling modules 106) and/or other components positioned in electronic rack 100. To do so, fluid recirculation system 125 may be adapted for fluid communication with these components and/or sources of coolant. For example, fluid recirculation system 125 may include any number of fluid lines, manifolds, valves, reservoirs, and/or ports that allow for fluid paths between sources of coolant and components positioned in electronic rack 100 to be formed by making appropriate fluid connections between these components.

In one embodiment, fluid recirculation system 125 includes a rack manifold in fluid communication with ports 127 for external connection with other devices. Lines or other fluid flow structures may be attached to ports 127 to place the fluid recirculation system 125 in fluid communication with other devices, such as a coolant source (which may be implemented as a separate device and/or as a portion (entirely or in part) of electronic rack 100).

The rack manifold may also include ports (not shown) for fluid connection with server chassis 105, rack manager 104, power supply units 103, and/or other components positioned in electronic rack 100. For example, when these components are positioned in electronic rack 100, the ports of the rack manifold may be placed in proximity (or in communication with) to ports on these components thereby facilitating formation of fluid communication paths between the devices positioned in electronic rack 100 and fluid recirculation system 125. While the components are positioned in electronic rack 100, fluid recirculation system 125 may allow for coolant from external (and/or internal to electronic rack 100) sources to be circulated through all, or a portion, of the components positioned in electronic rack 100.

To provide its functionality, the various components of electronic rack 100 may operate in a predetermined manner. For example, the fluid recirculation system 125 may operate within predetermined coolant pressure ranges. If the fluid recirculation system 125 is unable to operate within the predetermined coolant pressure ranges, then the electronic rack 100 may provide degraded functionality, may be entirely or partially inoperable, or may otherwise deviate from its expected functionality. Similarly, the cooling modules 106 positioned with the server chassis 105 may operate with predetermined heat dissipation rates while coolant is circulated through them at a predetermined rate. If the cooling modules 106 are unable to dissipate heat at the predetermined rate, then the electronic rack may deviate from its expected functionality. In a further example, the computing components (e.g., processors, memory modules, storage modules, communications devices, special purpose hardware devices, etc.) positioned with the server chassis 105 may operate with predetermined heat generation rates while performing predetermined workloads. If the computing components generate a greater amount of heat than expected when the predetermined workloads are performed, then the electronic rack 100 may deviate from its expected functionality.

To reduce the likelihood of an electronic rack 100 deviating from its expected functionality (e.g., while deployed), the electronic rack 100 may be subjected to thermal, fluid, workload, and/or other types of testing prior to deployment (e.g., the testing may be performed at a remote manufacturing facilitate, onsite where the electronic rack will be deployed to a computing environment, or at other locations prior to installing the electronic rack in a deployment or after installation as part of an ongoing maintenance/validation program). If the electronic rack 100 meets testing expectations, then it may be sent to a deployment for use and/or kept in a deployment if already deployed. If the electronic rack 100 does not meeting testing expectations, then it may not be sent to the deployment until it is remediated (e.g., repaired, modified, or otherwise changed until it meets the testing expectations) or may be removed from the deployment for remediation if already deployed.

Figure 1B:
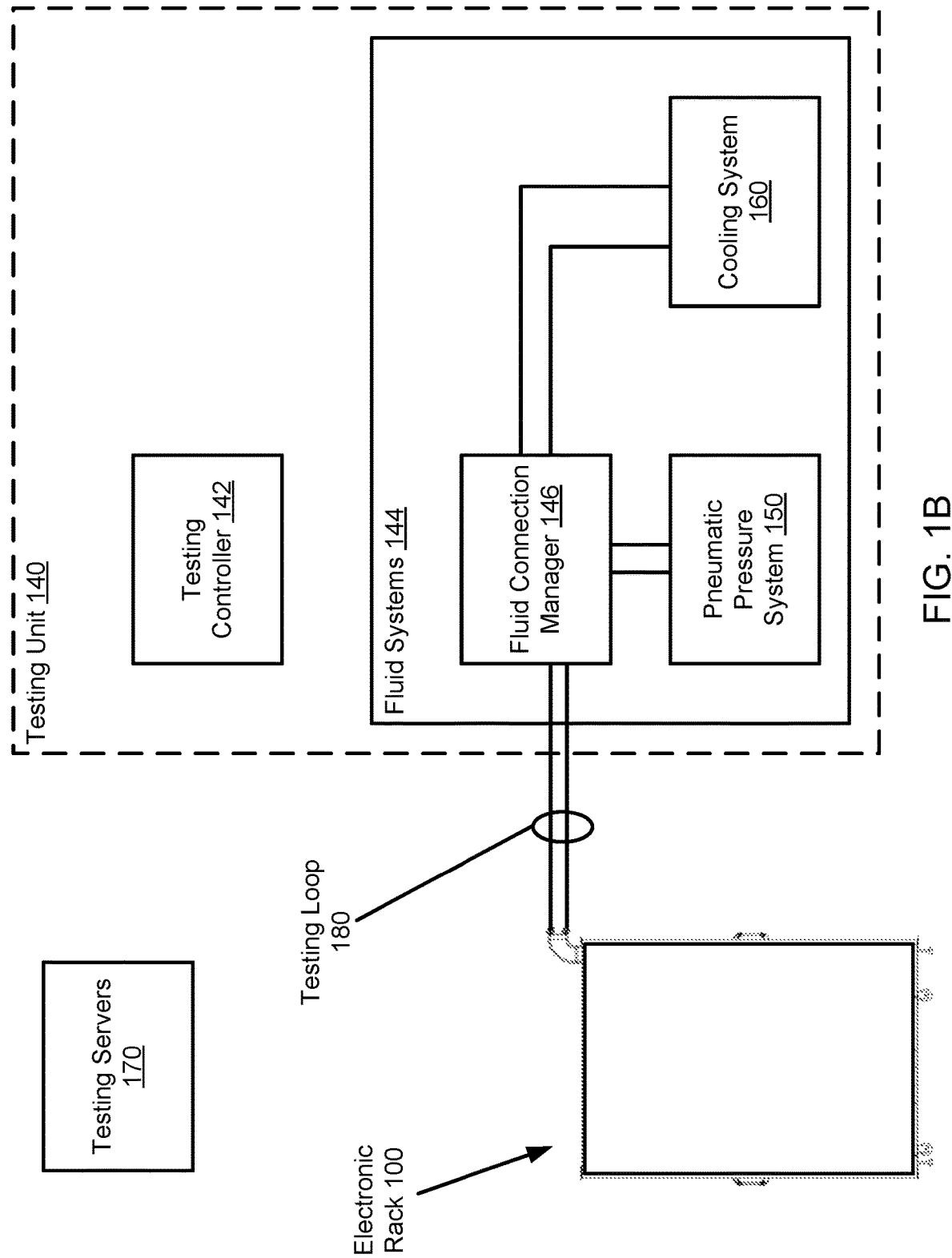
FIG. 1B shows a diagram of a testing environment according to an embodiment.

Turning to FIG. 1B, a testing topology in accordance with one or more embodiments is shown. The testing topology may provide for automated testing of any number of electronic rack 100. To test an electronic rack, the electronic rack may be placed in fluid communication with a testing unit 140 and operable communication with testing servers 170. For example, testing unit 140 may be fluidly connected to electronic rack 100 with a testing loop 180 (e.g., connected to fluid recirculation system 125) and the rack manager 104 may be operably connected to testing servers 170 via a network. The testing unit 140 and testing servers 170 may automatically perform pre-deployment testing of the electronic rack when so connected and/or post-deployment testing if already deployed. While illustrated in some figures as being a separate structure, in an embodiment, the testing servers 170 and testing unit 140 are integrated together as a single unit.

The testing unit 140 may provide for automated physical testing of electronic rack 100. To do so, the testing unit 140 may be adapted to selectively and reversibly (i) circulate coolant to electronic rack 100, (ii) pressurize electronic rack 100, and/or (iii) depressurize electronic rack 100. The testing unit 140 may perform its functionality in cooperation with other components that participate in the testing of electronic rack 100. To provide its functionality, testing unit 140 may include a testing controller 142 and fluid systems 144.

Fluid systems 144 may include physical devices for circulating fluids to electronic rack 100, pressurizing electronic rack 100, and depressurizing electronic rack 100. For example, fluid systems 144 may include a pneumatic pressure system 150 and a cooling system 160. Each of these systems may be in fluid communication with a fluid connection manager 146.

Fluid connection manager 146 may selectively and reversibly fluidly connect and/or isolate the pneumatic pressure system 150 and the cooling system 160 to the electronic rack 100. These fluid connections may be changed over time to subject the electronic rack 100 to different types of testing.

Cooling system 160 may provide for the circulation of coolant to electronic rack 100. Cooling system 160 may cool heated coolant (and/or may compress vaporized coolant) from electronic rack and circulate cooled coolant to electronic rack.

Pneumatic pressure system 150 may provide for the pressurization (e.g., above a normal operating pressure of components under test, and may be set to several time larger than the normal operating pressure, such as 3 or 5 times more than the normal operating pressure; the specific pressure may be based on the various components under test, a type of electronic rack, etc.) and depressurization (e.g., to establish a vacuum environment within the components under test) of components of electronic rack 100 through which cooling liquid is circulated (referred to in aggregate as the "cooling components"). For example, pneumatic pressure system 150 may pump gasses such as air, nitrogen, or other types of gasses into the cooling components of electronic rack 100 to pressurize the cooling components and/or may pump gasses out of the cooling components of electronic rack 100 to depressurize them.

Figure 1C:
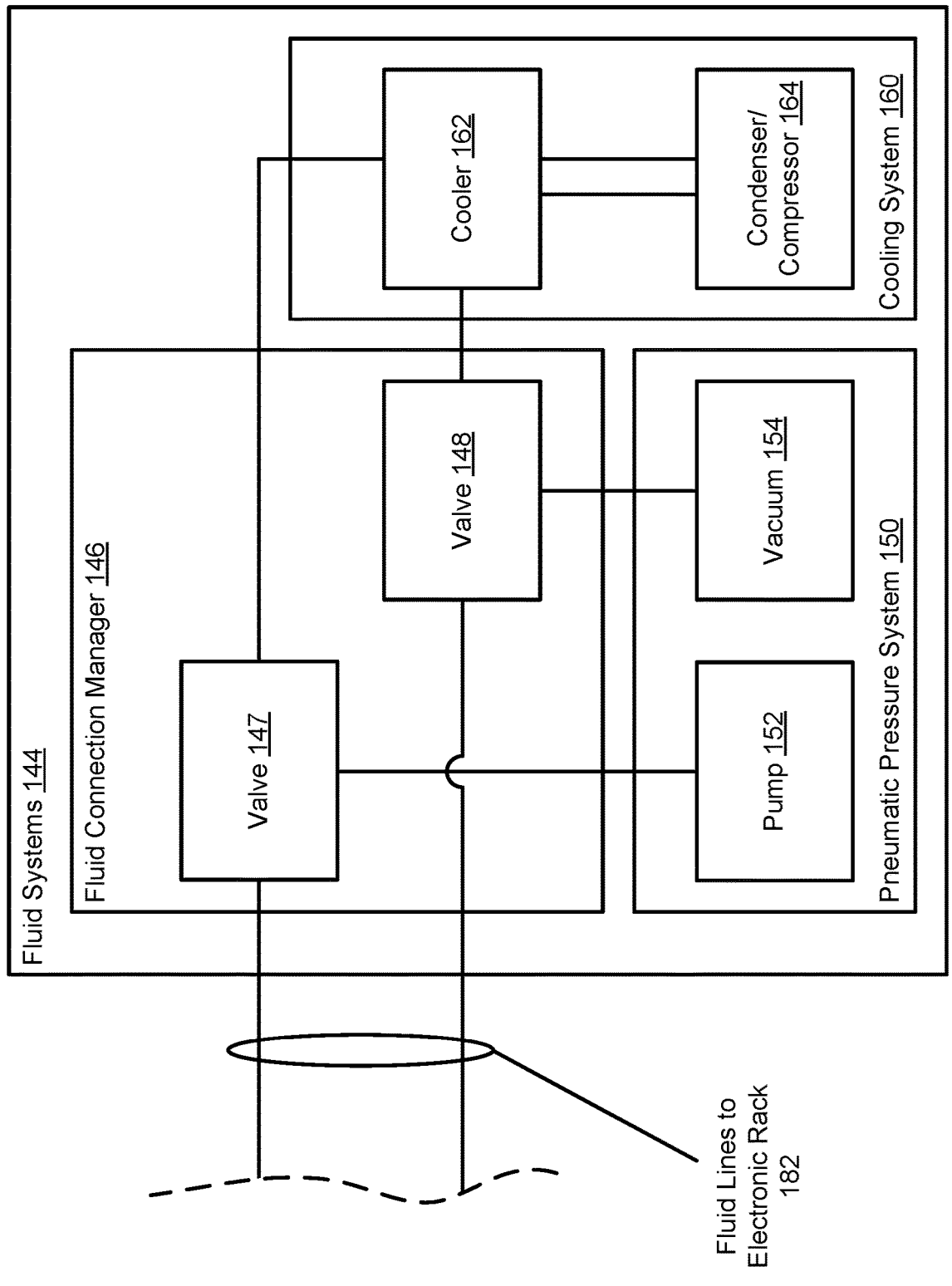
FIG. 1C shows a diagram of fluid systems according to an embodiment.

For additional details regarding fluid systems 144 and/or components thereof, refer to FIG. 1C.

The components of fluid systems 144 may be operably connected to testing controller 142. Through the operably connections, testing controller 142 may orchestrate the operation of these components.

Testing controller 142 may cooperate with testing servers 170 to provide for testing of electronic rack 100. For example, testing controller 142 may operate the components of the fluid systems 144 over time in accordance with a test plan and/or in cooperation with the testing servers.

In one embodiment, testing controller 142 is implemented with one or more computing devices. The one or more computing devices may include, for example, one or more of each of processors, memory modules (e.g., devices that provide transitory storage), storage modules (e.g., devices that provide persistent storage), communications devices, etc. When providing its functionality, testing controller 142 may perform all, or a portion, of the methods illustrated and described throughout this application. To do so, the processors may execute computing instructions stored in persistent storage (local and/or remote) that cause the processors to perform the methods and functions disclosed throughout this application. These processors may be implemented with hardware processors that include circuitry. The processors may execute the computing instructions directly or may do so through one or more layers of virtualization or other types of indirection. In an embodiment, testing controller 142 is implemented with a special purpose hardware device that includes circuitry adapted to provide the functionality of testing controller 142. The special purpose hardware device may be, for example, a programmable gate array, an application specific integrated circuit, a digital signal processor, or any other type of hardware device. This may provide an efficient mean to load different workload or testing models for different racks and servers.

Testing servers 170 may provide for load testing and collecting of testing information from electronic rack 100. For example, during various phases of testing electronic rack 100, testing servers 170 may instantiate various workloads in server chassis or other components positioned in electronic rack 100. Additionally, during various phases of testing electronic rack 100, testing servers 170 may retrieve information regarding the operation of electronic rack 100.

To do so, testing servers 170 may be operably connected with electronic rack 100 and rack manager 104 positioned therein. Through the operably connection, testing servers 170 may cooperatively instantiate the workloads with assistance from rack manager 104. For example, rack manager 104 may be operably connected to the components in electronic rack 100 that perform the workloads and may cause the workloads to be performed with these connections (e.g., by communicating instructions).

In an embodiment, the testing servers 170, testing controller 142, and/or rack manager 104 host an instance of an application used to orchestrate testing of electronic rack 100. These instances of the application may cooperate with one another to provide for the automated testing of electronic rack 100. These application instances may communicate and cooperate using any command and control scheme (e.g., message passing, publish-subscribe, etc.) without departing from embodiments disclosed herein.

In one embodiment, testing servers 170 are implemented with one or more computing devices. The one or more computing devices may include, for example, one or more of each of processors, memory modules (e.g., devices that provide transitory storage), storage modules (e.g., devices that provide persistent storage), communications devices, etc. When providing its functionality, testing servers 170 may perform all, or a portion, of the methods illustrated and described throughout this application. To do so, the processors may execute computing instructions stored in persistent storage (local and/or remote) that cause the processors to perform the methods and functions disclosed throughout this application. These processors may be implemented with hardware processors that include circuitry. The processors may execute the computing instructions directly or may do so through one or more layers of virtualization or other types of indirection. In an embodiment, testing servers 170 are implemented with a special purpose hardware device that includes circuitry adapted to provide the functionality of testing servers 170. The special purpose hardware device may be, for example, a programmable gate array, an application specific integrated circuit, a digital signal processor, or any other type of hardware device.

Figure 2:
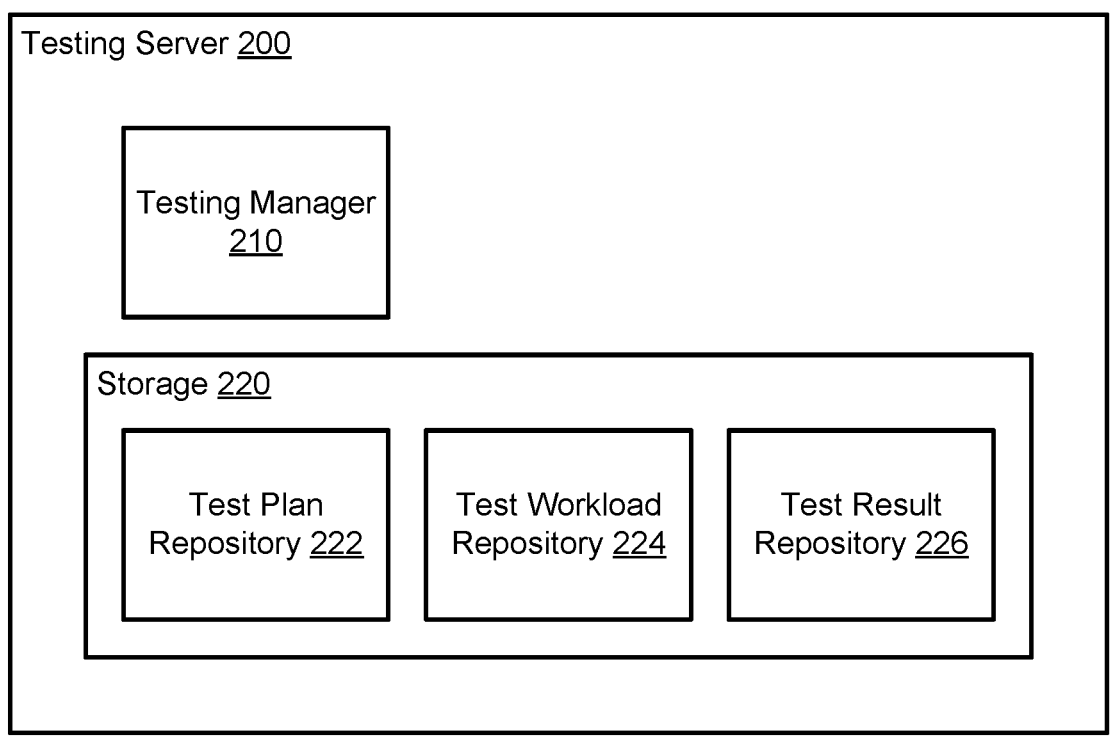
FIG. 2 shows a diagram of a test server according to one embodiment.

For additional details regarding testing servers 170, refer to FIGS. 1D and 2.

Testing loop 180 may include any number and type of fluid flow components (e.g., lines, manifolds, valves, etc.) to facilitate formation of fluid flow paths between electronic rack 100. For example, testing loop 180 may include lines (e.g., 182 shown in FIG. 1C) between ports 127 and fluid systems 144 that form a loop with electronic rack 100.

Turning to FIG. 1C, a diagram of fluid systems 144 in accordance with one or more embodiments is shown. As noted above, fluid systems 144 may include various components, operably connected to a testing controller, to facilitate physical testing of electronic rack 100.

To facilitate reversible formation of fluid connections between pneumatic pressure system 150, cooling system 160, and an electronic rack (e.g., via fluid lines 182), fluid connection manager 146 may include one or more valves 147, 148. The valves 147, 148, may be three-way valves (e.g., 3-port valves). Each of the three-way valves may include three fluid ports attached to a body. The body may change the fluid connections between the three ports thereby allowing for different fluid connections to be established and terminated over time. A first port of each of the three way valves may be in fluid communication with electronic rack 100 while electronic rack 100 is subjected to testing. A second port of each of the three-way valves may be in fluid communication with pneumatic pressure system 150 (e.g., more specifically, a second port of one three-way valve may be fluidly connected to pump 152 and a second port of another three-way valve may be fluidly connected to vacuum 154). A third port of each of the three-way valves may be in fluid communication with cooling system 160. Consequently, through the valves 147, 148, electronic rack 100 may be reversibly placed in fluid communication with pneumatic pressure system 150 or cooling system 160. For additional details regarding these different fluid connection scenarios, refer to FIGS. 3B-3D.

Each of the valves 147, 148 may include embedded controllers, motors, actuators, and/or other devices to allow for the valves to be fluidly reconfigured. The embedded controllers may be operably connected to the testing controller 142 and may reconfigure the fluid connections between the ports of the valves 147, 148 based on information (e.g., instructions) received from the testing controller 142.

Pneumatic pressure system 150 may include pump 152 and vacuum 154. Pump 152 may be adapted to pump gasses (e.g., air or other gasses). When in fluid communication with fluid recirculation system 125, pump 152 may be usable to pressurize cooling components and cooling loops of electronic rack to a pressure above a normal operation pressure of fluid recirculation system 125. Pump 152 may be implemented with, for example, an electrically driven pump operably connected to and controllable by testing controller 142.

Vacuum 154 may be adapted to vacuum gasses (e.g., pump out air or other gasses). When in fluid communication with fluid recirculation system 125, vacuum 154 may be usable to depressurize cooling components of electronic rack 100 to establish a vacuum environment in fluid recirculation system 125. Vacuum 154 may be implemented with, for example, an electrically driven pump operably connected to and controllable by testing controller 142.

Cooling system 160 may include cooler 162 and condenser/compressor 164. Cooler 162 may cool a coolant circulated to electronic rack 100. When in fluid communication with fluid recirculation system 125, cooler 162 may be usable to remove heat from coolant received from electronic rack 100. Cooler 162 may be implemented with, for example, a heat exchange, a heat dissipater, and/or other components usable to remove heat from a coolant.

In an embodiment, cooling system 160 includes and/or is operably connected to two or more cooling sources (e.g., 164 and/or other components not illustrated in FIG. 1C). The cooling sources may be adapted to cool cooler 162 by, for example, circulating a cooling fluid to cooler 162. The cooling sources may cool the cooling fluid via any method without departing from embodiments disclosed herein.

Condenser/compressor 164 may be adapted to condense vapor into coolant. When in fluid communication with fluid recirculation system 125, condenser/compressor 164 may be usable to condense vapor from the electronic rack 100 into coolant. Condenser/compressor 164 may be implemented with, for example, an electrically driven compressor and/or condenser. In an embodiment, condenser/compressor 164 may be implemented with any type of cooling units or cooling source for delivering cooling fluid to cool the cooler 162. In an embodiment as shown in FIG. 1C, condenser/compressor 164 can include a liquid cooled condenser, air cooled condenser, or a different type of device for delivering cooling fluid to cooler 162.

While not illustrated in FIG. 1C, fluid systems 144 may also include other types of fluid flow components such as, for example, pumps to pump coolant to and/or from electronic rack 100, reservoirs of coolant and/or gasses, etc.

Turning to FIG. 1D, a diagram of a communication environment in accordance with one or more embodiments is shown. As discussed above, various components may communicate with one another while cooperatively performing automated testing of an electronic rack. To do so, any of rack manager 104, testing controller 142, testing servers 170, and servers 190 (e.g., computing devices housed in server chassis 105 of electronic rack 100) may be operably connected to one another with one or more wired and/or wireless networks (e.g., 175). Network 175 may facilitate communications between these components (with one or more networks including, for example, the Internet). While components illustrated in FIG. 1D are shown as separate device, any of the functionality of any of these devices may be implemented with a single device that provide all, or a portion, of the functionalities of these devices.

Turning to FIG. 2 a diagram of a testing server 200 in accordance with one or more embodiments is shown. The testing server 200 may be similar to any of testing servers 170 discussed throughout this application. In one embodiment, the testing server can be part of the testing unit. The testing server may be deployed with different testing workload or models, such as different benchmarking workloads.

Testing server 200 may cooperatively provide for automated testing of electronic rack 100. To do so, testing server 200 may include testing manager 210 and storage 220. Each of these components is discussed below.

Testing manager 210 may orchestrate testing of an electronic rack. Testing of an electronic rack may include (i) circulating coolant through cooling components of the electronic rack, (ii) pressurizing the cooling components, (iii) depressurizing the cooling components, (iv) performing workloads with the electronic rack, (v) thermal cycling the electronic rack, and/or (vi) comparing the operation of the electronic rack (e.g., monitoring with sensors) during i-v to expected operation of the electronic rack.

While orchestrating test of the electronic rack, testing manager 210 may communicate with other components (e.g., testing controllers, rack managers, etc.) to invoke the functionalities of these other components. For example, these other components may implement instances of testing manager 210 or other entities hosted by these other components which may respond to the communications from the testing manager 210 instances hosted by testing server 200.

Figure 3A:
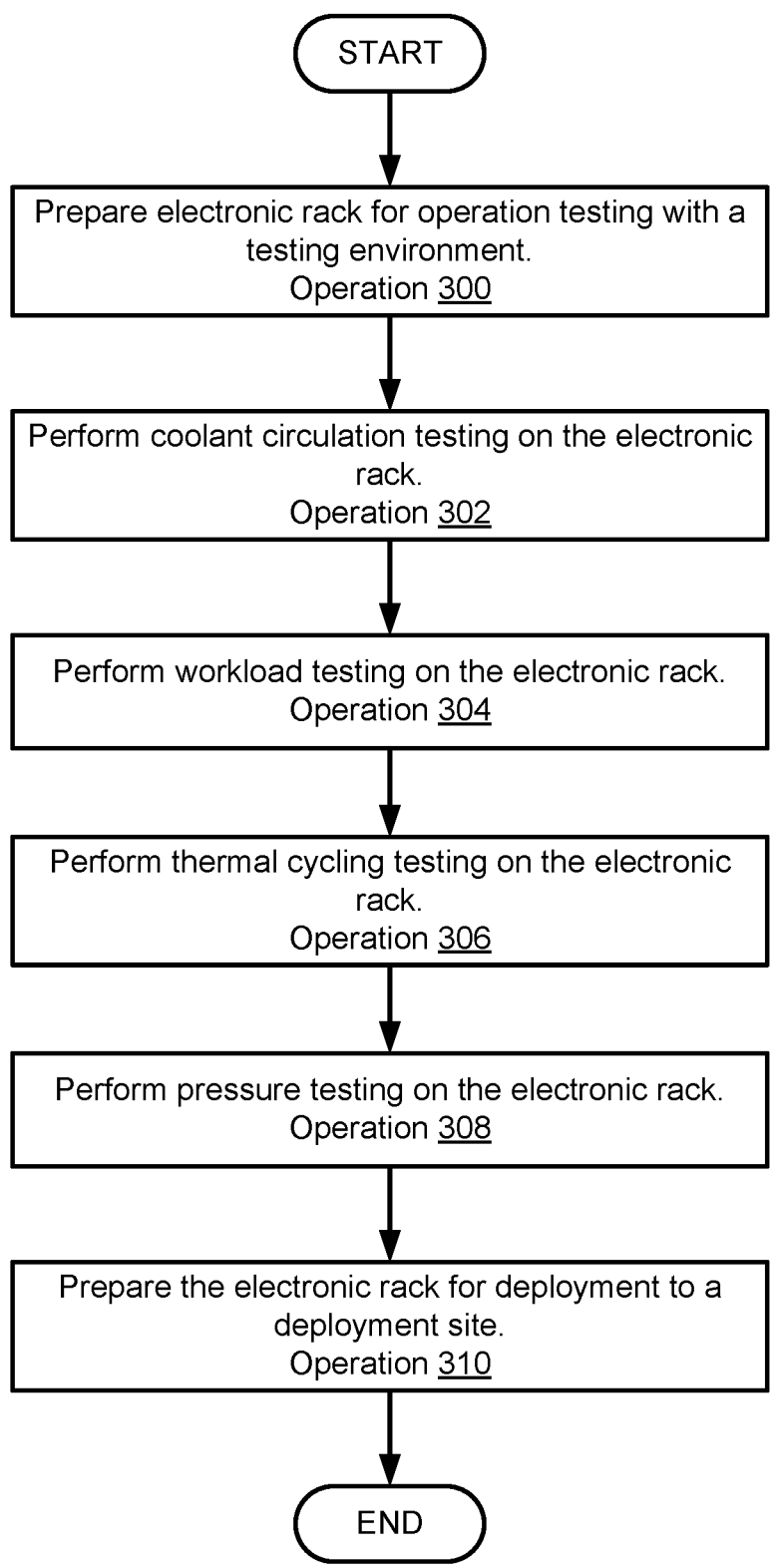
FIG. 3A shows a flow diagram of a method of determining a deployment state of an electronic rack according to one embodiment.

When providing its functionality, testing manager 210 may perform all, or a portion, of the method illustrated in FIG. 3A and its functionality described throughout this application.

In an embodiment, testing manager 210 is implemented with a processor of testing server 200. The processor may include circuitry that provides the functionality of testing manager 210 when the processor executes computing instructions stored in persistent storage. In an embodiment, testing manager 210 is implemented with a special purpose hardware device such as, for example, a programmable gate array, an application specific integrated circuit, a digital signal processor, or another type of hardware device that includes circuitry adapted to provide the testing manager 210 functionality.

Storage 220 may store data structures used by testing manager 210 when performing its functionality. The data structures may include test plan repository 222, test workload repository 224, and testing results repository 226. Each of these data structures is discussed below.

Test plan repository 222 may include one or more data structures that include information regarding how to test an electronic rack. The information may include, for example, any number of actions to be performed by the components of the system of FIG. 1B to test electronic rack 100. Test plan repository 222 may include any number of test plans and each of the test plans may be associated with corresponding electronic racks at any level of granularity (e.g., per rack basis where each test plan corresponds to a specific rack, an electronic rack type basis where a test plan corresponding to electronic racks of a particular type, etc.).

The testing manager 210 may, for example, match an identity of an electronic rack to a test plan stored in test plan repository 222, and implement the matched test plan. When implementing the test plan, the testing manager 210 may send information regarding different acts to be performed by different actors in the system illustrated in FIG. 1B.

Test workload repository 224 may include one or more data structures that include information regarding workloads to be performed during various test plans. For example, the test workload repository 224 may specify workloads to be performed by various components of an electronic rack during testing. The test plans in the test plan repository 222 may reference these test workloads specified by the test workload repository 224, which may be implemented when a corresponding test plan is being used to test an electronic rack.

Test results repository 226 may include one or more data structures that include information regarding the operation of an electronic rack during the testing and/or comparisons between its operation and expected operation. For example, while an electronic rack is being tested, various information may be collected from the electronic rack and/or test unit cooperatively testing the electronic rack. The collected information may be stored in test result repository 226. The information may include, for example, detections of coolant leaks, pressures in cooling components, temperatures of various components, power consumption by various components such as servers in server chassis, temperatures of the ambient environment in which the electronic rack is positioned. The collected information may be compared to a standard for the electronic rack to determine whether the electronic rack is ready for deployment (e.g., is likely to operate in a predetermined manner). The results of the comparison may also be stored in the test result repository 226.

In an embodiment, different testing servers of testing servers 170 may include different data structures (e.g., different test plans, test workloads, metrics for determining compliance with respect to expected operation of tested devices, etc.). These different testing servers may be utilizes to provide for automated testing of different electronic racks that may have different use case scenarios.

Storage 220 may be implemented using any number and type of data storage device including, for example, hard disk drives, solid state drives, memory modules, controllers, and/or other hardware components. These components may provide for the persistent storage of the data structures, discussed above.

Turning to FIG. 3A, a flow diagram of a method of testing an electronic rack is shown. In the flow diagram, various operations are shown and illustrated. Any of the operations may be performed in a parallel or partially overlapping in time manner, any of the operations may be performed in different orders from that illustrated in FIG. 3A, any of the operations may be performed any number of times, and the method in its entirety may be performed any number of times.

In operation 300, an electronic rack is prepared for operation testing with a testing environment. The electronic rack may be prepared for operation testing by placing it in fluid and operable connection with other components, illustrated and described with respect to FIG. 1B.

In operation 302, coolant circulating testing on the electronic rack is performed. The coolant circulation testing may be performed by, for example, a testing server and/or a testing unit. For example, the testing unit may send a communication to a testing controller of the testing server indicating that coolant is to be circulated to an electronic rack through a fluid connection.

In response to the communication, the testing controller may reconfigure a fluid connection manager 146 to place a cooling system 160 in fluid communication with the electronic rack (while isolating a pneumatic pressure system from the electronic rack). Once the fluid connection manager is reconfigured, the testing controller may activate pumps, a cooler, and/or a condenser/compressor to be circulate the coolant to the electronic rack.

Figure 3B:
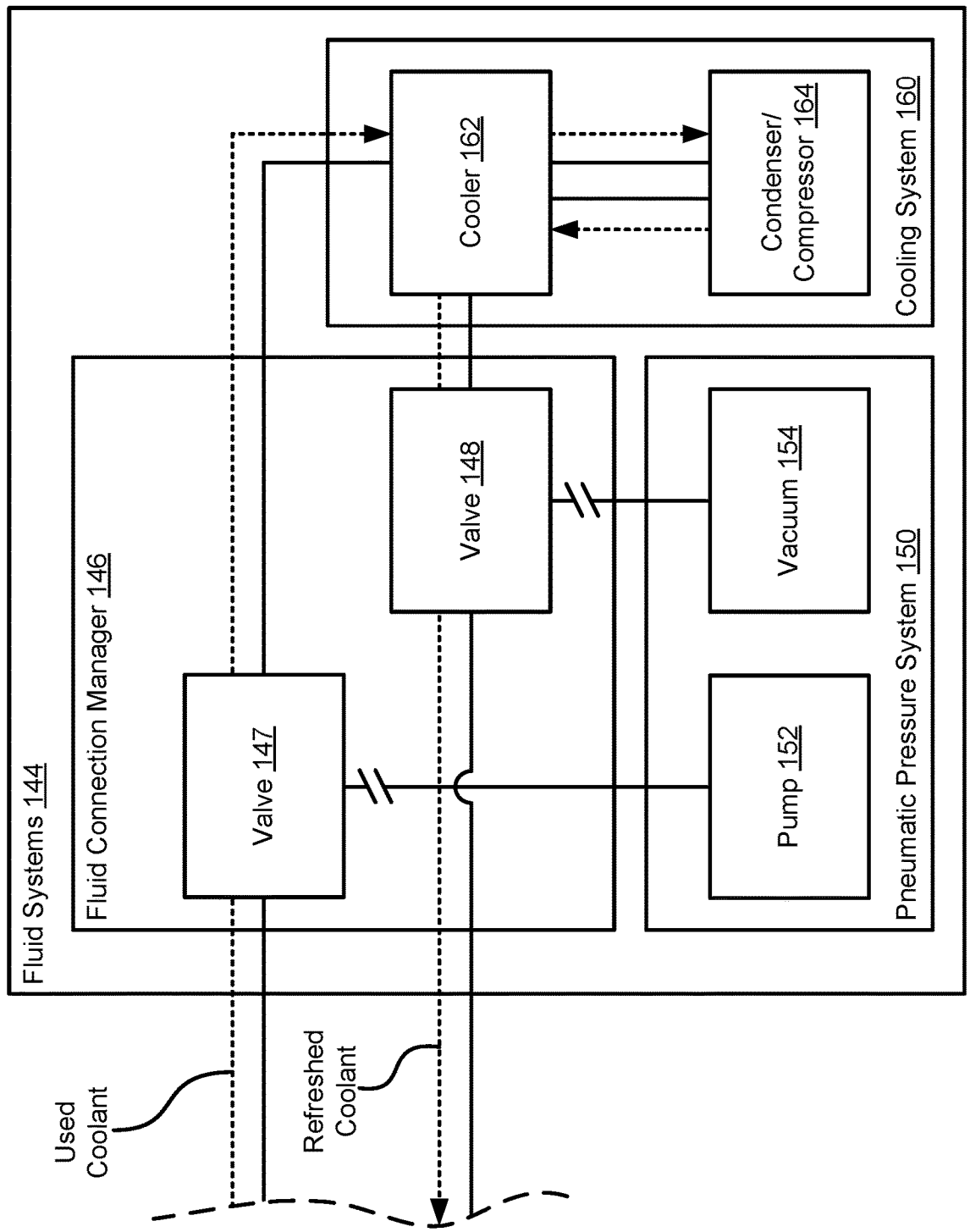
FIG. 3B shows a diagram of a first configuration of fluid systems according to one embodiment.

Turning to FIG. 3B, a diagram illustrating a first configuration of the fluid systems 144 is shown. A seen in FIG. 3B, valves 147, 148 may be reconfigured to (i) disconnect pump 152 and vacuum 154 (indicated in this figure and FIGS. 3C and 3D by the broken lines between the valves and these components) and (ii) connect the cooling system 160 (indicated by the unbroken line between the valves and the cooling system 160). Once connected, refreshed coolant (indicated with dashed lines) may be pumped from the cooling system 160 and into the electronic rack for circulation. The refreshed coolant may be a cooled fluid usable to cool components in an electronic rack. Similarly, used coolant (e.g., coolant that has been circulated through the cooling components of an electronic rack and may be a hot return fluid) may be retrieved from the electronic rack and pumped to the cooling system 160.

When pumped to the cooling system 160, the used coolant may be circulated through cooler 162 and/or condenser/compressor 164 (as illustrated by the dashed lines) to obtain refreshed coolant.

Returning to the discussion of FIG. 3A, while the coolant circulation testing is performed on the electronic rack, operation information may be collected. For example, a rack manager operably connected to components in the electronic rack (such as coolant leak sensors) may collect information regarding coolant leaks within electronic rack 100. The collected information may indicate the presence, or lack thereof, of coolant leaks with electronic rack 100.

In operation 304, workload testing on the electronic rack is performed. The workload testing on the electronic rack may be performed by instantiating one or more workloads on servers or other components of electronic rack 100. The workloads may cause, for example, servers positioned in electronic rack 100 to perform computations. Performing the computations may consume electrical power and generate heat as a byproduct of the computations.

In an embodiment, the workload testing is performed by instantiating example workloads that are likely to be performed with the electronic rack when the electronic rack is deployed. For example, the workload repository may include workloads corresponding to different use cases for electronic rack 100. A workload corresponding to the use case for the electronic rack similar to that it will face during deployment may be used for workload testing purposes.

In an embodiment, the workload testing is performed by instantiating workloads that are being performed by already-deployed electronic racks and/or with certain workload specified or otherwise customized to a need of a future operator of the electronic rack under test. For example, the testing server may coordinate with the deployed electronic rack to duplicate or transfer an on-going workload at a deployment to the electronic rack (in part or entirely) under testing. In another example, the testing server may instantiate particular workloads that the future operation of the electronic rack under test specifies, requests, etc.

While the workload testing is being performed, operation information may be obtained from various components of the electronic rack. The operation information may include, for example, (i) temperatures of components in electronic rack (e.g., over time to ascertain whether the components are being appropriately cooled), (ii) power consumption by some of the components, (iii) computation rates of some of the components, (iv) pressures within the cooling components (e.g., cooling plates, rack manifolds, etc.), and/or (v) other performance information.

While described with respect to a workload, operation 304 may be performed repeatedly for an array of different workloads to obtain operation data under a variety of different workload and operating conditions. The collected operation data may be stored as part of the testing results repository and compared to expected operation data, corresponding to the different workload and operating conditions to ascertain whether the electronic rack is ready for deployment.

In operation 306, thermal cycling testing is performed on the electronic rack. The thermal cycling testing may be performed by increasing and decreasing the temperature of electronic rack 100.

In an embodiment, the operation of various cooling components of electronic rack 100 and/or testing unit cooperatively testing electronic rack 100 is modified to cause the temperature of various components of electronic rack 100 to increase and decrease over time (e.g., to thermally cycle). For example, the rate at which coolant and/or cooling airflows in electronic rack 100 may be decreased and increased over time to modulate the temperatures within electronic rack.

In an embodiment, external heaters and/or various air flows through electronic rack 100 are modulated to increase and decrease the temperature of various components of electronic rack 100 to increase and decrease (e.g., to thermally cycle).

The electronic rack may be subjected to thermal cycling via other methods without departing from embodiments disclosed herein.

While the thermal cycle testing is being performed, operation information may be obtained from various components of the electronic rack. The operation information may include, for example, (i) temperatures of components in electronic rack (e.g., over time to ascertain whether the components are being appropriately cooled), (ii) power consumption by some of the components, (iii) computation rates of some of the components, (iv) pressures within the cooling components (e.g., cooling plates, rack manifolds, etc.), and/or (v) other performance information.

In operation 308, pressure testing is performed on the electronic rack. Prior to operation 308, coolant may be removed from the electronic rack (e.g., by pumping it out through fluid lines 182 shown in FIG. 1C).

After the coolant is removed from the electronic rack, the testing unit may be reconfigured to place a pump in fluid communication with the cooling components of the electronic rack. For example, testing server may communicate with the testing controller of the testing unit to indicate that the testing unit is to be reconfigured and to pressurize the electronic rack after reconfiguration.

Figure 3C:
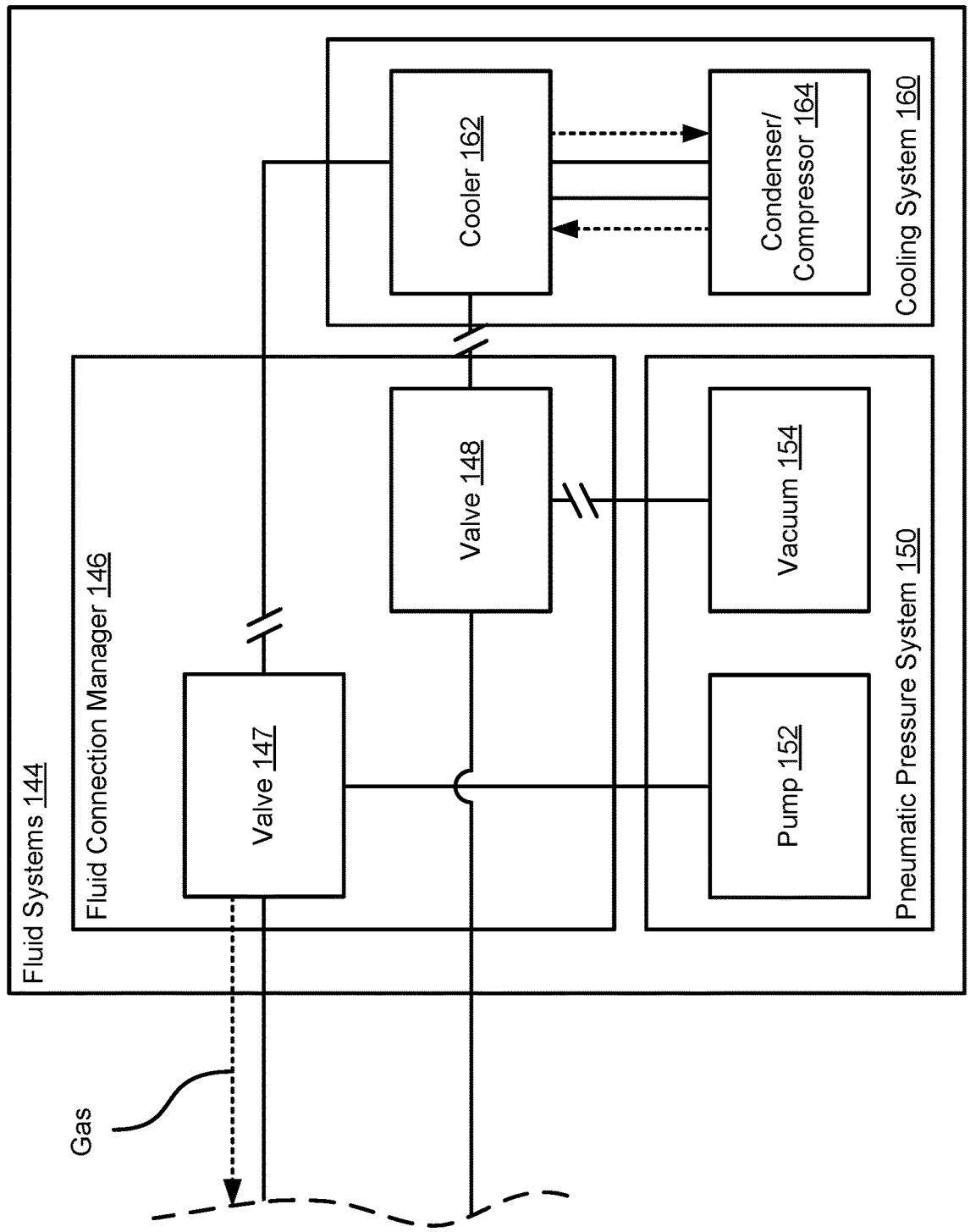
FIG. 3C shows a diagram of a second configuration of fluid systems according to one embodiment.

Turning to FIG. 3C, a diagram illustrating a second configuration of the fluid systems 144 is shown. A seen in FIG. 3C, valves 147, 148 may be reconfigured to (i) disconnect vacuum 154 and cooling system 160 from the electronic rack and (ii) connect pump 152 to the electronic rack. Once pump 152 is connected, gas may be pumped into the cooling components of the electronic rack. Pumping the gas into the cooling components may increase the pressure in these components above normal operating pressure. For example, the gas may be pumped until the cooling components reach significantly above normal operating pressure. The gas may be, for example, air, nitrogen, or other types of gasses. In an embodiment, pressure sensors (e.g., 113) are used for measuring how much the pressure varies over time.

Once the cooling components reach the elevated pressure, the valves 147, 148 may be sealed. While sealed, the pressure in the cooling components may be monitored (e.g., with a pressure monitor of the fluid systems 144, of the electronic rack, or a separate device such as one in line with the fluid lines 182) over time to ascertain whether the gas is leaking from the cooling components.

Returning to the discussion of FIG. 3A, a testing server may record the pressures over time and compare the recorded pressures in the cooling components to predetermined pressures indicating gas leaks. For example, the rack manager, testing controller, and/or other components may send the results of such measurements to the testing server. Based on the comparison the testing server may ascertain whether a leak is present. The testing server may record the pressuring testing results in the test result repository.

In operation 310, the electronic rack is prepared for deployment to a deployment site. To prepare the electronic rack for deployment, the testing unit may be reconfigured to place a vacuum in fluid communication with the cooling components of the electronic rack. For example, testing server may communicate with the testing controller of the testing unit to indicate that the testing unit is to be reconfigured and to depressurize the electronic rack after reconfiguration. In an embodiment, the rack cooling loop is set to vacuum status.

Figure 3D:
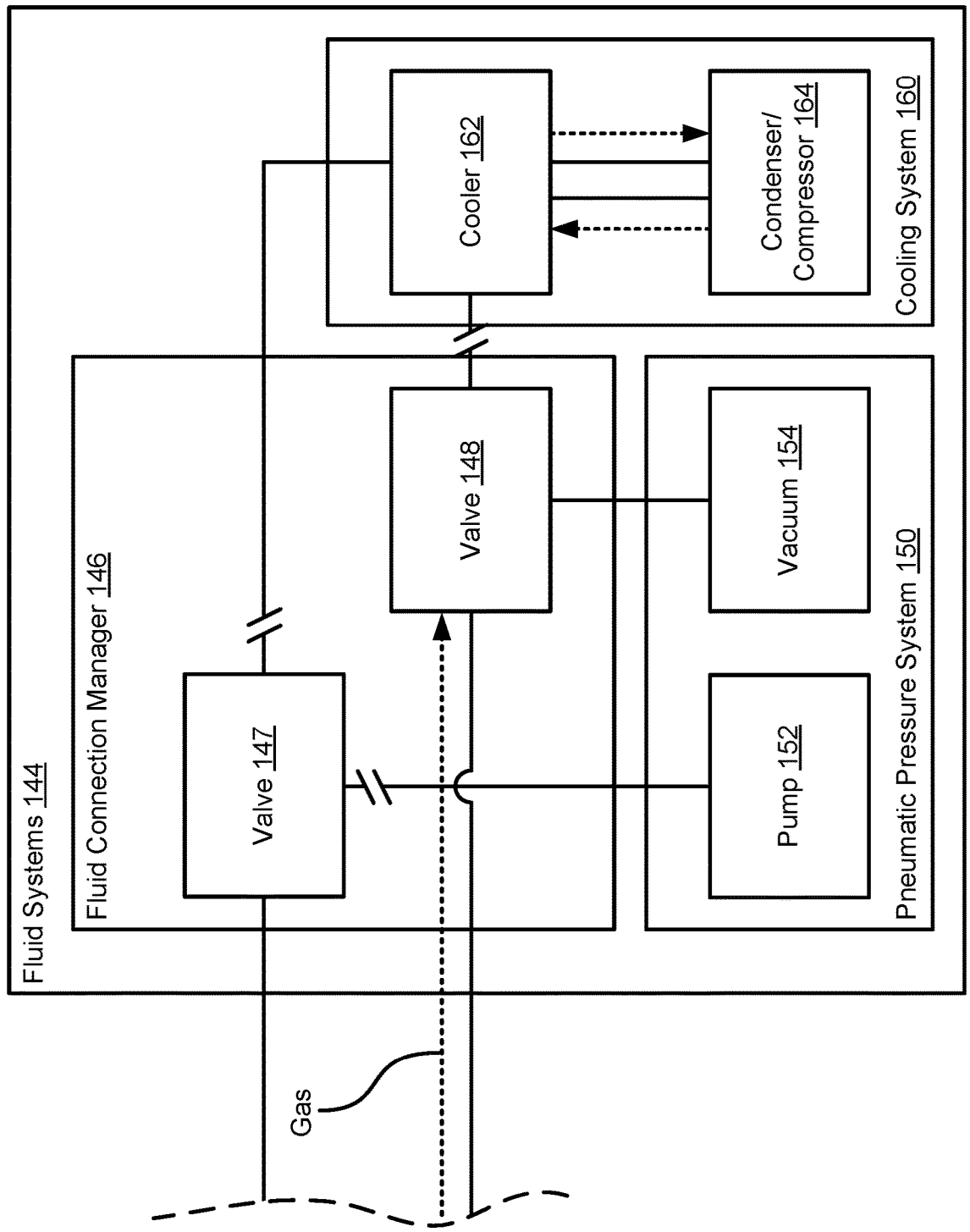
FIG. 3D shows a diagram of a third configuration of fluid systems according to one embodiment.

Turning to FIG. 3D, a diagram illustrating a third configuration of the fluid systems 144 is shown. A seen in FIG. 3D, valves 147, 148 may be reconfigured to (i) disconnect pump 152 and cooling system 160 from the electronic rack and (ii) connect vacuum 154 to the electronic rack. Once vacuum 154 is connected, gas may be pumped out of the cooling components of the electronic rack. Pumping the gas out of the cooling components may decrease the pressure in these components to establish a vacuum environment. For example, the gas may be pumped out of the cooling components until the cooling components until the pressure within the cooling components establishes a vacuum.

Once the cooling components are have a vacuum environment established therein, the electronic rack may be shipped for deployment. When deployed in this state, coolant circulation may be initiated with a lesser likelihood of trapped air or other gasses preventing coolant circulation to various portions of the electronic rack and/or components positioned therein.

Returning to the discussion of FIG. 3A, a testing server may record the reduced pressure in the cooling components over time and compare the recorded pressures in the cooling components to predetermined pressures. For example, the rack manager, testing controller, and/or other components may send the results of such measurements to the testing server. Based on the comparison the testing server may ascertain whether the electronic rack is in condition for deployment. The testing server may record the testing results in the test result repository.

The method may end following operation 310.

Using the method illustrated in FIG. 3A, a deployment state for an electronic rack may be determined. For example, if the electronic rack does not operate in a manner consistent with the predetermined operation expectations, then the electronic rack may be determined to not be in a deployable state. If it is determined that the electronic rack is not in a deployable state, the information collected regarding its operation during testing may be utilized to ascertain how to remediate the electronic rack.

Additionally, as discussed with respect to operations 300-310, various comparisons between the actual operation and expected operation of electronic rack during the testing. If the electronic rack deviates in actual operation from the expected operation, the determination may be made without performing other portions of the testing.

For example, consider a scenario where coolant circulation testing is performed in operation 302. If a leak is identified during the coolant circulation testing, then the deployment state of the electronic rack may be immediately determined without performing any other operations and the method may end.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A testing system for preparing electronic racks comprising servers for a deployment and a fluid recirculation system to cool the servers, the testing system comprising:
 a testing unit configured to:
  apply fluids to an electronic rack of the electronic racks, and
  fluidly prepare the electronic rack for coolant when deployed to the deployment; and
 a testing server comprising a processor and memory, the processor, when executing a set of computing instructions, is configured to:
  perform, with the testing unit, a coolant circulation testing on the fluid recirculation system and collect operation data during the coolant circulation testing;
  perform, with the testing unit, a workload testing on the electronic rack and collect operation data during the workload testing;
  perform, with the testing unit, a thermal cycle testing on the electronic rack and collect operation data during the thermal cycle testing;
  perform, with the testing unit, a pressure testing on the fluid recirculation system and collect operation data during the pressure testing;
  determine whether the operation data corresponding to the coolant circulation testing, the workload testing, the thermal cycle testing, and the pressure testing meet testing expectations; and
  prepare, with the testing unit, the electronic rack for the deployment in response to determining that the operation data corresponding to the coolant circulation testing, the workload testing, the thermal cycle testing, and the pressure testing meet the testing expectations.

2. The testing system of claim 1, wherein the workload testing and the thermal testing are both performed, at least in part, while the coolant circulation testing is performed.

3. The testing system of claim 1, wherein the pressure testing is performed after the coolant circulation testing is complete.

4. The testing system of claim 1, wherein the workload testing comprises instantiating a particular workload specified by a future operator of the electronic rack.

5. The testing system of claim 1, wherein the fluids comprise a coolant circulated during the coolant circulation testing.

6. The testing system of claim 5, wherein the fluids further comprise a gas pumped into the fluid recirculation system during the pressure testing.

7. The testing system of claim 6, wherein the coolant is dumped prior to the gas being pumped into the fluid recirculation system to remove the coolant.

8. The testing system of claim 1, wherein the testing unit comprises:
 a pneumatic pressure system;
 a cooling system; and
 a fluid connection manager configured to:
  fluidly couple the pneumatic pressure system to the fluid recirculation system,
  fluidly isolate the pneumatic pressure system from the fluid recirculation system,
  fluidly couple the cooling system to the fluid recirculation system, and
  fluidly isolate the cooling system from the fluid recirculation system.

9. The testing system of claim 8, wherein the pneumatic pressure system comprises:
 a pump configured to pressurize the fluid recirculation system to a first pressure above normal operating pressure of the fluid recirculation system while the pump is fluidly coupled to the fluid recirculation system; and
 a vacuum configured to depressurize the fluid recirculation system to establish a vacuum environment in the fluid recirculation system while the pump is fluidly coupled to the fluid recirculation system.

10. The testing system of claim 9, wherein preparing, with the testing unit, the electronic rack for the deployment comprises:
 fluidly isolating, with the fluid connection manager, the pump from the fluid recirculation system;
 fluidly isolating, with the fluid connection manager, the cooling system from the fluid recirculation system; and
 operating the vacuum while the vacuum is fluidly coupled to the fluid recirculation system until the fluid recirculation system is depressurized to a second pressure.

11. The testing system of claim 9, wherein performing, with the testing unit, the pressure testing on the electronic rack comprises:
 fluidly isolating, with the fluid connection manager, the vacuum from the fluid recirculation system;

fluidly isolating, with the fluid connection manager, the cooling system from the fluid recirculation system;
operating the pump while the pump is fluidly coupled to the fluid recirculation system until the fluid recirculation system is pressurized to the first pressure;
while operating the pump, collecting operation data for the fluid recirculation system, wherein the operation data during the pressure testing comprises the operation data for the fluid recirculation system; and
storing the operation data for the fluid recirculation system in a test result repository.

12. The testing system of claim 8, wherein the cooling system comprises:
a cooler configured to cool coolant circulating through it while the cooler is fluidly coupled to the fluid recirculation system.

13. The testing system of claim 8, wherein the cooling system comprises:
a cooler used to cool the coolant; and
a cooling source, coupled to the cooler, the cooling sources being adapted to cool the cooler.

14. The testing system of claim 8, wherein the fluid connection manager comprises:
a first three-way valve; and
a second three-way valve,
wherein a first fluid port of the first three-way valve is configured for reversible fluid connection to the fluid recirculation system, a second fluid port of the first three-way valve is fluidly connected to the pneumatic pressure system, and a third fluid port of the first three-way valve is fluidly connected to the cooling system,
wherein a first fluid port of the second three-way valve is configured for reversible fluid connection to the fluid recirculation system, a second fluid port of the second three-way valve is fluidly connected to the pneumatic pressure system, and a third fluid port of the second three-way valve is fluidly connected to the cooling system.

15. The testing system of claim 14, wherein the first three-way valve and the second three-way valve are both operably connected to the testing server, and the testing server is configured to control the first three-way valve and the second three-way to form:
a first fluid flow path between the fluid recirculation system and the pneumatic pressure system; and
a second fluid flow path between the fluid recirculation system and the cooling system.

16. The testing system of claim 15, wherein forming the first fluid flow path seals the second fluid flow path, and forming the second fluid flow path seals the first fluid flow path.

17. A method for preparing electronic racks comprising servers for a deployment and a fluid recirculation system to cool the servers, the method comprising:
performing, with a testing unit, a coolant circulation testing on the fluid recirculation system of an electronic rack of the electronic racks by circulating a first fluid through the fluid recirculation system and collecting operation data during the coolant circulation testing;
performing, with the testing unit, a workload testing on the electronic rack and collecting operation data during the workload testing;
performing, with the testing unit, a thermal cycle testing on the electronic rack and collecting operation data during the thermal cycle testing;
performing, with the testing unit, a pressure testing on the fluid recirculation system by pumping a second fluid into the fluid recirculation system and collecting operation data during the pressure testing;
determining whether the operation data corresponding to the coolant circulation testing, the workload testing, the thermal cycle testing, and the pressure testing meet testing expectations; and
preparing, with the testing unit, the electronic rack for the deployment by vacuuming the second fluid out of the fluid recirculation system in response to determining that the operation data corresponding to the coolant circulation testing, the workload testing, the thermal cycle testing, and the pressure testing meet the testing expectations.

18. The method of claim 17, wherein pumping the second fluid into the fluid recirculation system raises a pressure of the fluid recirculation system above a normal operating pressure of the fluid recirculation system, and vacuuming the second fluid out of the fluid recirculation system reduces the pressure of the fluid recirculation system to establish a vacuum environment in the fluid recirculation system.

19. The method of claim 17, wherein the coolant circulation testing, the workload testing, the thermal cycle testing, and the pressure testing are automatically performed by the testing unit without changing any external fluid connections between the testing unit and the fluid recirculation system.

20. The method of claim 19, wherein the coolant circulation testing, the workload testing, the thermal cycle testing, and the pressure testing are automatically performed by switching internal fluid connections of the testing unit.

* * * * *